US012322669B2

(12) United States Patent
Che et al.

(10) Patent No.: US 12,322,669 B2
(45) Date of Patent: Jun. 3, 2025

(54) SUBSTRATE INTEGRATED WITH PASSIVE DEVICES AND MANUFACTURING METHOD THEREOF

(71) Applicants: Beijing BOE Sensor Technology Co., Ltd., Beijing (CN); BOE TECHNOLOGY GROUP CO., LTD., Beijing (CN)

(72) Inventors: Chuncheng Che, Beijing (CN); Feng Liu, Beijing (CN); Yuelei Xiao, Beijing (CN); Yue Li, Beijing (CN); Guochen Du, Beijing (CN); Xue Cao, Beijing (CN); Yifan Wu, Beijing (CN); Wenbo Chang, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/772,272

(22) PCT Filed: Apr. 23, 2021

(86) PCT No.: PCT/CN2021/089225
§ 371 (c)(1),
(2) Date: Apr. 27, 2022

(87) PCT Pub. No.: WO2022/222131
PCT Pub. Date: Oct. 27, 2022

(65) Prior Publication Data
US 2024/0145321 A1 May 2, 2024

(51) Int. Cl.
*H01L 23/15* (2006.01)
*H01F 41/04* (2006.01)
(Continued)

(52) U.S. Cl.
CPC .............. *H01L 23/15* (2013.01); *H01F 41/04* (2013.01); *H01L 23/5222* (2013.01);
(Continued)

(58) Field of Classification Search
CPC . H01L 23/15; H01L 23/5222; H01L 23/5226; H01L 23/5227; H01L 28/10;
(Continued)

(56) References Cited

U.S. PATENT DOCUMENTS

2014/0035935 A1* 2/2014 Shenoy ................... H01L 24/19
174/257
2014/0268616 A1* 9/2014 Lan ......................... H01L 28/60
716/110

(Continued)

FOREIGN PATENT DOCUMENTS

| CN | 102136430 A | 7/2011 |
|---|---|---|
| CN | 104517953 A | 4/2015 |

(Continued)

*Primary Examiner* — Joseph C. Nicely
*Assistant Examiner* — Alvin L Lee
(74) *Attorney, Agent, or Firm* — HOUTTEMAN LAW LLC

(57) ABSTRACT

A substrate integrated with passive devices and a manufacturing method thereof are provided. The manufacturing method of the substrate integrated with passive devices includes: providing a transparent dielectric layer with first connection vias therein, wherein the transparent dielectric layer includes a first surface and a second surface, which are opposite to each other along a thickness direction of the transparent dielectric layer; integrating the passive devices onto the transparent dielectric layer, wherein the passive devices include at least an inductor, the integrating the passive devices onto the transparent dielectric layer includes: forming first sub-structures on the first surface of the transparent dielectric layer, forming second sub-structures on the second surface, and forming first connection
(Continued)

electrodes in the first connection vias, respectively; wherein the first sub-structures, the first connection electrodes and the second sub-structures are connected together to form a coil structure of the inductor.

20 Claims, 6 Drawing Sheets

(51) Int. Cl.
    *H01L 23/522*    (2006.01)
    *H10D 1/20*    (2025.01)
    *H10D 1/60*    (2025.01)
    *H10D 1/68*    (2025.01)

(52) U.S. Cl.
    CPC ...... *H01L 23/5226* (2013.01); *H01L 23/5227* (2013.01); *H10D 1/20* (2025.01); *H10D 1/68* (2025.01); *H10D 1/692* (2025.01); *H10D 1/60* (2025.01)

(58) Field of Classification Search
    CPC ....... H01L 28/40; H01L 28/60; H01L 23/522; H01F 41/04; H01F 17/0013; H01F 41/041

See application file for complete search history.

(56) References Cited

U.S. PATENT DOCUMENTS

| | | | |
|---|---|---|---|
| 2018/0138102 A1* | 5/2018 | Pan | H10K 50/805 |
| 2020/0275558 A1* | 8/2020 | Fujita | H01L 21/4857 |
| 2021/0118698 A1* | 4/2021 | Sawadaishi | H01L 23/15 |
| 2021/0298172 A1* | 9/2021 | Onohara | H01F 27/363 |
| 2022/0014176 A1* | 1/2022 | Lan | H03H 1/00 |
| 2022/0346226 A1* | 10/2022 | Onohara | H05K 1/162 |

FOREIGN PATENT DOCUMENTS

| | | |
|---|---|---|
| CN | 104737246 A | 6/2015 |
| CN | 111769808 A | 10/2020 |
| CN | 111834341 A | 10/2020 |

* cited by examiner

SUBSTRATE INTEGRATED WITH PASSIVE DEVICES AND MANUFACTURING METHOD THEREOF

CROSS-REFERENCE TO RELATED APPLICATIONS

This is a National Phase Application filed under 35 U.S.C. 371 as a national stage of PCT/CN2021/089225 filed on Apr. 23, 2021, the content of which is incorporated herein by reference in its entirety.

TECHNICAL FIELD

The present disclosure belongs to the technical field of radio frequency devices, and particularly relates to a substrate integrated with passive devices and a manufacturing method thereof.

BACKGROUND

Nowadays, the consumer electronics industry is developing day by day. Mobile communication terminals represented by mobile phones, especially 5G mobile phones, are developing rapidly. The frequency bands of signals to be processed by the mobile phones are increasing, and the number of RF (radio frequency) chips required is also increasing. The mobile phone form enjoyed by consumers is developing continuously towards miniaturization, lightness and thinness and long power-supply durability per charging cycle. In traditional mobile phones, a large number of discrete components such as resistors, capacitors, inductors, filters, and the like exist on the RF PCB board. The discrete components have the disadvantages of large volume, high power consumption, multiple welding spots and large parasitic parameter change, making it difficult to meet future requirements. The interconnection, matching and the like between RF chips require an integrated passive device with small area, high performance and good consistency. The integrated passive devices currently available on the market are mainly based on Si (silicon) substrates and GaAs (gallium arsenide) substrates. A Si-based integrated passive device has the advantage of low price, but Si itself has trace impurities (poor insulation), which leads to high microwave loss and average performance of the device; a GaAs-based integrated passive device has the advantage of excellent performance, but is expensive.

SUMMARY

Some embodiments of the present disclosure provide a substrate integrated with passive devices and a manufacturing method thereof.

An embodiment of the present disclosure provides a manufacturing method of a substrate integrated with passive devices, including:
    providing a transparent dielectric layer with first connection vias therein, wherein the transparent dielectric layer includes a first surface and a second surface, which are opposite to each other along a thickness direction of the transparent dielectric layer;
    integrating the passive devices onto the transparent dielectric layer, wherein the passive devices include at least an inductor,
    wherein the integrating the passive devices onto the transparent dielectric layer includes:
        forming first sub-structures on the first surface of the transparent dielectric layer, forming second sub-structures on the second surface, and forming first connection electrodes in the first connection vias respectively; wherein the first sub-structures, the first connection electrodes and the second sub-structures are connected together to form a coil structure of the inductor.

Providing the transparent dielectric layer includes processing the transparent dielectric layer to form the first connection vias penetrating through the transparent dielectric layer in the thickness direction of the transparent dielectric layer;
    forming the first connection electrodes in the first connection vias includes making the first connection electrodes at least cover inner walls of the first connection vias;
    forming a pattern including the second sub-structures on the second surface through a patterning process; and
    forming a pattern of the first sub-structures on the first surface through a patterning process.

Prior to the forming the first connection electrodes in the first connection vias, the manufacturing method further includes:
    attaching the first surface of the transparent dielectric layer to a first substrate;
    the manufacturing method further includes:
    prior to forming the first sub-structures, peeling off the first substrate from the first surface of the transparent dielectric layer; and attaching a second substrate to a side of the second sub-structures away from the transparent dielectric layer.

Forming the first connection vias is subsequent to the forming the second sub-structures.

The forming the first connection vias includes:
    thinning the transparent dielectric layer, and processing the transparent dielectric layer to form the first connection vias penetrating through the transparent dielectric layer in the thickness direction of the transparent dielectric layer.

The passive devices further includes a capacitor; the manufacturing method further includes:
    forming a pattern including a first plate of the capacitor on the second surface through a patterning process;
    forming a first interlayer dielectric layer on a side of the first plate of the capacitor distal to the transparent dielectric layer;
    forming a pattern including a second plate of the capacitor on a side of the first interlayer dielectric layer distal to the transparent dielectric layer, through a patterning process.

The second sub-structures include a first conductive film layer and a second conductive film layer sequentially arranged along a direction away from the second surface;
    the first conductive film layer and the first plate of the capacitor are manufactured through one patterning process;
    the manufacturing method further includes:
    forming a second interlayer dielectric layer on a side of the second plate of the capacitor distal to the transparent dielectric layer, and forming a second connection via penetrating through the first interlayer dielectric layer and the second interlayer dielectric layer;
    wherein the second conductive film layer is formed on a side of the second interlayer dielectric layer distal to the transparent dielectric layer, and is connected to the first conductive film layer through the second connection via.

The manufacturing method further includes: grinding the first conductive film layer and the first plate of the capacitor.

The manufacturing method further includes:
  forming a third connection via penetrating through the second interlayer dielectric layer while forming the second connection via; forming a second connection electrode while forming the second conductive film layer, wherein the second connection electrode is connected to the second plate of the capacitor through the third connection via;
  sequentially depositing a first protective layer and a first planarization layer on a side of the second conductive film layer and the second connection electrode distal to the second interlayer dielectric layer;
  forming a fourth connection via and a fifth connection via penetrating through the first protective layer and the first planarization layer; and
  forming a first connection pad and a second connection pad; wherein the first connection pad is connected to a lead terminal of the inductor through the four connection via, and the second connection pad is connected to the second connection electrode through the fifth connection pad.

In a case where the first connection electrodes do not fully fill the first connection vias, respectively, forming filling structures in the first connection vias, respectively, between the forming the first connection electrodes and the forming the second sub-structures.

The manufacturing method further includes:
  sequentially forming a second protective layer and a second planarization layer on a side of the first sub-structures distal to the transparent dielectric layer.

The transparent dielectric layer includes a glass substrate.

An embodiment of the present disclosure provides a substrate integrated with passive devices, including a transparent dielectric layer and the passive devices integrated on the transparent dielectric layer, wherein
  the transparent dielectric layer includes a first surface and a second surface which are opposite to each other along a thickness direction of the transparent dielectric layer; and the transparent dielectric layer has therein first connection vias penetrating through the transparent dielectric layer along the thickness direction of the transparent dielectric layer;
  the passive devices include at least an inductor; the inductor includes first sub-structures on the first surface, second sub-structures on the second surface, and first connection vias respectively in the first connection vias for sequentially connecting the first sub-structures and the second sub-structures together.

The passive devices further include a capacitor, the capacitor includes a first plate and a second plate sequentially arranged along a direction away from the second surface, and a first interlayer dielectric layer is between layers where the first plate and the second plate are located, respectively.

The second sub-structures include a first conductive film layer and a second conductive film layer sequentially arranged along a direction away from the second surface;
  the first conductive film layer and the first plate of the capacitor are in a same layer and include a same material;
  a second interlayer dielectric layer is on a side of the second plate of the capacitor distal to the transparent dielectric layer, the second conductive film layer is on a side of the second interlayer dielectric layer distal to the transparent dielectric layer; the second conductive film layer is connected to the first conductive film layer through a second connection via which penetrates through the first interlayer dielectric layer and the second interlayer dielectric layer.

DETAIL DESCRIPTION OF EMBODIMENTS

In order enable one of ordinary skill in the art to better understand the technical solutions of the present disclosure, the present disclosure is further described below in detail with reference to the accompanying drawings and exemplary embodiments.

Unless defined otherwise, technical or scientific terms used herein shall have the ordinary meaning as understood by one of ordinary skill in the art to which the present disclosure belongs. The words "first", "second", and the like used in the present disclosure do not denote any order, quantity, or importance, but rather distinguish one element from another. Likewise, the word "a", "an", "the", or the like does not denote a limitation of quantity, but rather denotes the presence of at least one element. The word "comprising", "including", or the like, means that the element or item preceding the word contains the element or item listed after the word and its equivalent, but does not exclude other elements or items. The term "connected", "coupled", or the like is not restricted to physical or mechanical connections, but may includes electrical connections, whether direct or indirect connections. "Upper", "lower", "left", "right", and the like are used only to indicate relative positional relationships, and when the absolute position of the object being described is changed, the relative positional relationships may also be changed accordingly.

Embodiments of the present disclosure provide a substrate integrated with passive devices and a manufacturing method thereof (i.e., a method for manufacturing a substrate integrated with passive devices). Passive devices such as capacitors, inductors, resistors, etc. are integrated on a substrate to form a circuit structure. In the embodiments of the present disclosure, as an example, an LC oscillation circuit is integrated on a substrate. That is, at least devices such as an inductor, a capacitor, or a resistor are integrated on the substrate.

Figure 1:
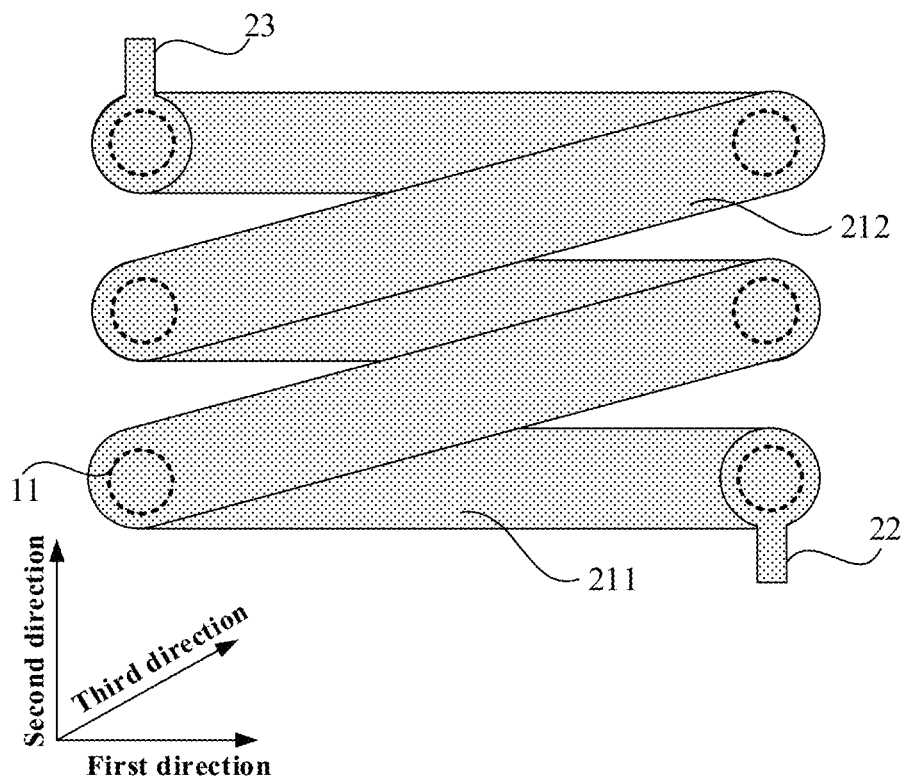
FIG. 1 is a top view of an inductor according to an embodiment of the present disclosure.

FIG. 1 is a top view of an inductor according to an embodiment of the present disclosure. Referring to FIG. 1, each of first sub-structures 211 of the inductor extends along a first direction and is arranged side by side along a second direction; each of second sub-structures 212 of the inductor extends along a third direction and is arranged side by side along the second direction. The first direction, the second direction, and the third direction are all different directions. In the embodiment of the present disclosure, the first direction and the second direction are perpendicular to each other, and the first direction and the third direction intersect and are non-perpendicular to each other. Alternatively, the extending directions of the first sub-structure 211 and the second sub-structure 212 may be interchanged, which is also within the protection scope of the embodiments of the present disclosure. In addition, in the embodiment of the present disclosure, the inductor includes N first sub-structures 211 and N−1 second sub-structures 212 as an example for description, wherein N is greater than or equal to 2, and N is an integer. Orthogonal projections of a first end and a second end of each of the first sub-structures 211 on a glass substrate 10 at least partially overlap with an orthogonal projection of one first connection via 11 on the glass substrate 10, respectively. The first end and the second end of each first sub-structure 211 correspond to different first connection vias 11, i.e., an orthogonal projection of one first sub-structure 211 on the glass substrate 10 at least partially overlaps orthogonal projections of two first connection vias 11 on the glass substrate 10, respectively. In this case, the first end and the second end of an i-th second sub-structure 212 of the inductor are connected to the first end of an i-th first sub-structure 211 and the second end of an (i+1)th first sub-structure 211, respectively, to form an inductor coil, where i is greater than or equal to 1 and less than or equal to N−1 (i.e., 1≤i≤N−1), and i is an integer.

It should be noted that, a first lead terminal 22 is connected to the second end of a first one of the first sub-structures 211 of the inductor coil, and a second lead terminal 23 is connected to the first end of the N-th first sub-structure 211. Further, the first lead terminal 22 and the second lead terminal 23 may be arranged in the same layer as the second sub-structures 212 and made of the same material. In this case, the first lead terminal 22 may be connected to the second end of the first one of the first sub-structures 211 through a corresponding first connection via 11, and correspondingly, the second lead terminal 23 may be connected to the first end of the N-th first sub-structure 211 through a corresponding first connection via 11.

Figure 2:
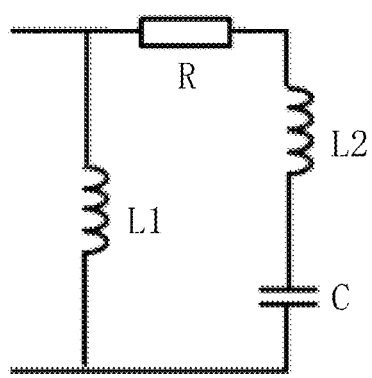
FIG. 2 is a diagram of an LC oscillation circuit.

FIG. 2 is a diagram of an LC oscillation circuit. As shown in FIG. 2, the LC oscillation circuit includes two inductors, one capacitor and one resistor. For convenience of understanding, the two inductors are referred to as a first inductor L1 and a second inductor L2, respectively. With continued reference to FIG. 2, a first lead terminal of the first inductor L1 is connected to a first end of the resistor R, a second lead terminal of the first inductor is connected to a second plate of the capacitor C, a first lead terminal of the second inductor L2 is connected to a second end of the resistor R, and a second lead terminal of the second inductor L2 is connected to a first plate of the capacitor C.

It should be noted that the resistor R may be implemented by a wire, or made of a high-resistance material, such as indium tin oxide (ITO) or nickel chromium (NiCr) alloy. In the embodiment of the present disclosure, the formation of the resistor R is not limited. The following mainly describes the inductor and the capacitor.

Figure 3:
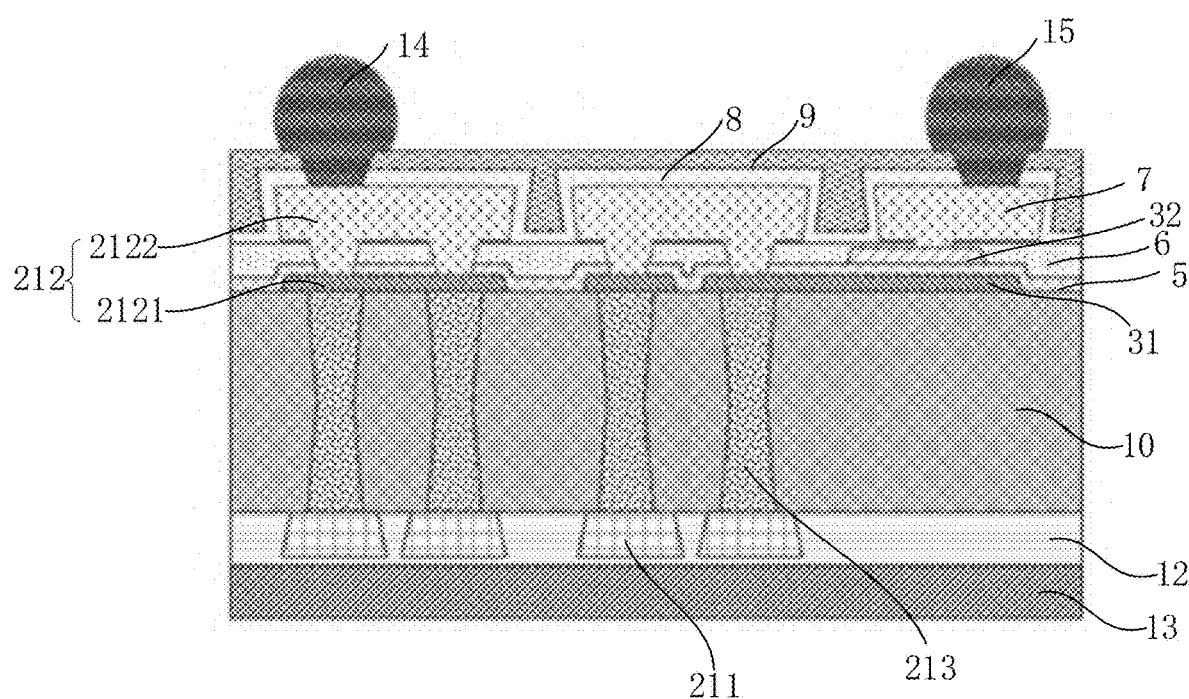
FIG. 3 is a schematic view of a substrate integrated with passive devices according to an embodiment of the present disclosure.

FIG. 3 is a schematic sectional view of a substrate integrated with passive devices according to an embodiment of the present disclosure. As shown in FIG. 3, the passive devices in the LC oscillation circuit shown in FIG. 2 are integrated on a transparent dielectric layer, which includes a first surface and a second surface oppositely arranged along a thickness direction thereof, and the transparent dielectric layer has first connection vias 11 penetrating through the transparent dielectric layer along the thickness direction thereof. First connection electrodes 213 of the inductor coil are formed in the first connection vias 11, respectively, the first sub-structures 211 of the inductor coil are formed on the first surface of the transparent dielectric layer, and the second sub-structures 212 of the inductor coil are formed on the second surface of the transparent dielectric layer. The transparent dielectric layer in the embodiment of the present disclosure includes, but is not limited to, any one of the glass substrate 10, a flexible substrate, and an interlayer dielectric layer including at least an organic insulating layer. The product, which is obtained by integrating the passive devices on the glass substrate 10, thus has the advantages of small volume, light weight, high performance, low power consumption, and the like, and the transparent dielectric layer is preferably the glass substrate 10 in the embodiment of the present disclosure. Hereinafter, description will be made by taking an example in which the transparent dielectric layer is the glass substrate 10.

With continued reference to FIG. 3, in some examples, the second sub-structure(s) 212 may include a first conductive film layer 2121 and a second conductive film layer 2122 sequentially arranged in a direction away from the glass substrate 10. The first plate 31 of the capacitor is arranged on the second surface, and arranged in the same layer as the first conductive film layer 2121 of the second sub-structures 212 of the inductor coil. A first interlayer dielectric layer 5 is arranged on a side of the first plate 31 of the capacitor away from (i.e., distal to) the glass substrate 10, and the second plate 32 of the capacitor is arranged on a side of the first interlayer dielectric layer 5 away from the first plate 31 of the capacitor. A second interlayer dielectric layer 6 is arranged on a side of the second plate 32 of the capacitor away from the glass substrate 10 or the first interlayer dielectric layer 5, the second conductive film layer 2122 and a second connection electrode 7 are arranged on a side of the second interlayer dielectric layer 6 away from the first interlayer dielectric layer 5 or the second plate 32. The second conductive film layer 2122 is connected to the first conductive film layer 2121 through second connection via(s) penetrating through the first interlayer dielectric layer 5 and the second interlayer dielectric layer 6; the second connection electrode 7 is connected to the second plate of the capacitor through a third connection via penetrating through the second interlayer dielectric layer 6. A first protective layer 8 and a first planarization layer 9 are sequentially arranged on a side of the second conductive film layer 2122 and the second connection electrode 7 away from the glass substrate 10; a fourth connection via 91 and a fifth connection via 92 penetrating through the first protective layer 8 and the first planarization layer 9 are formed. A first connection pad 14 and a second connection pad 15 are formed in the fourth connection via 91 and the fifth connection via 92, respectively. Each of the first connection pad 14 and the second connection pad 15 may be a solder.

With continued reference to FIG. 3, a second protective layer and a second planarization layer may be formed on a side of the first sub-structures 211 away from the glass substrate 10, to protect the first sub-structures 211 from water and oxygen corrosion.

The structural parameters of each device on the substrate integrated with the passive devices according to the embodiment of the present disclosure have not been described in detail till now, but will be individually explained in the following description of a manufacturing method.

An embodiment of the present disclosure provides a method for manufacturing a substrate integrated with passive devices, where the substrate may be the above-mentioned substrate, and the method includes steps of:

Providing a glass substrate 10, and processing the glass substrate 10 to obtain a glass substrate 10 with first connection vias 11; where the glass substrate 10 includes a first surface and a second surface oppositely arranged in a thickness direction thereof.

Integrating passive devices onto the glass substrate 10; where the passive devices include at least an inductor.

The integrating the passive device onto the glass substrate 10 includes the following:

Forming the first sub-structures 211 on the first surface of the glass substrate 10, forming the second sub-structures 212 on the second surface, and forming the first connection electrodes 213 in the first connection vias 11, respectively; where the first sub-structures 211, the first connection electrodes 213 and the second sub-structures 212 are connected together to form an inductor coil.

In order to clarify the manufacturing method in the embodiments of the present disclosure, the following describes a method for manufacturing a substrate integrated with passive devices in the embodiments of the present disclosure with reference to the drawings and specific embodiments.

Figure 4:
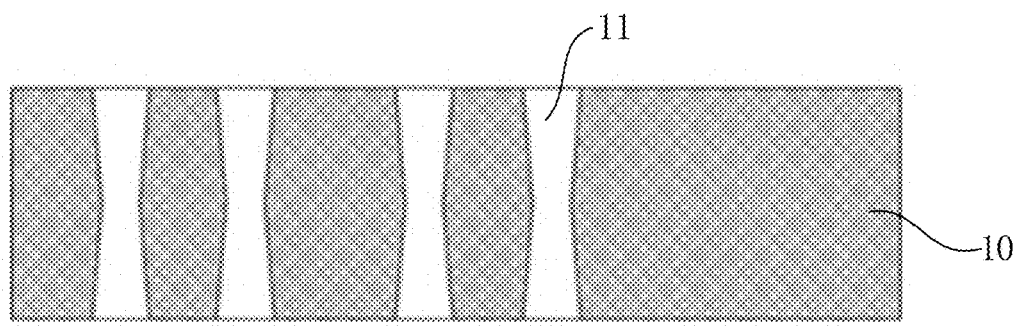
FIG. 4 is a schematic diagram of a substrate formed in step S11 according to an embodiment of the present disclosure.

A first example is a method for manufacturing a small-sized substrate integrated with passive devices thereon, the small-sized substrate having a size such as 4 inches, 6 inches, 8 inches, 12 inches, or the like, the method specifically includes the following steps:

Step S11, providing a glass substrate 10, and processing the glass substrate 10 to form first connection vias 11 penetrating through the glass substrate in the thickness direction of the glass substrate, as shown in FIG. 4.

In some examples, step S11 may include providing a glass substrate 10, modifying the first surface and the second surface of the glass substrate 10 by a laser, and forming a glass substrate 10 having therein the first connection vias 11 through HF etching.

For example, (1) Cleaning: the glass substrate 10 is placed into a cleaning machine for cleaning.

In some examples, the glass substrate 10 has a thickness of about 0.2 mm to 0.3 mm.

(2) Laser drilling: using a laser beam from a laser to hit the first surface of the glass substrate 10 for surface modification with the laser beam perpendicularly incident thereon, so as to form first sub-vias on the first surface side of the glass substrate 10; similarly, using the laser beam from the laser to hit the second surface of the glass substrate 10 for surface modification with the laser beam perpendicularly incident thereof, so as to form second sub-vias on the second surface side of the glass substrate 10, each of the second sub-vias and a corresponding one of the first sub-vias communicating with each other to form a corresponding first connection via 11.

Specifically, when the laser beam interacts with the glass substrate 10, atoms in the glass substrate 10 are ionized and ejected out of the first surface of the glass substrate 10 due to the high energy of the laser photons. As time increases, the punched vias are gradually deepened until the first sub-vias are formed. The glass substrate 10 is then turned over for forming the second sub-vias according to the same principle. A wavelength of the laser generally may be 532 nm, 355 nm, 266 nm, 248 nm, 197 nm, etc., a pulse width of the laser may be 1 fs to 100 fs, 1 ps to 100 ps, 1 ns to 100 ns, etc., and the type of the laser may be continuous laser, pulse laser, etc. The method of laser drilling may include, but is not limited to, the following two methods. In the first method, when the diameter of a light spot is large, the relative position of the laser beam and the glass substrate 10 is fixed, the glass substrate 10 is directly punched to a preset depth by high energy, the shape of each first sub-via formed at the moment is an inverted circular truncated cone, and the diameter of the inverted circular truncated cone is sequentially reduced from top to bottom (e.g., from the second surface to the first surface). In the second method, when the diameter of a light spot is small, the laser beam scans by drawing a circle on the glass substrate 10, the focus point of the light spot is constantly changed, the depth of the focus point is constantly changed, a spiral line is drawn from the lower surface (e.g., the first surface) of the glass substrate 10 to the upper surface (e.g., the second surface) of the glass substrate 10, the radius of the spiral line is sequentially reduced from bottom to top, the glass substrate 10 is cut into a shape of circular truncated cone by the laser to form a first blind via, and the shape of the first blind via is the first sub-via. The second sub-vias are formed in the same manner as the first sub-vias, thus the description thereof is not repeated. It can be seen that the first connection via 11, which is formed by a corresponding first sub-via and a corresponding second sub-via communicating with each other, has an hourglass shape.

Alternatively, each first connection via in the embodiment of the present disclosure may also be formed by irradiating the laser beam on only the first surface or the second surface of the glass substrate 10, to form connection via having a shape of a circular truncated cone or a cylinder, and the formation manner may be the same as one of those described above, thus the description thereof will not be repeated.

(3) HF etching: during the process of laser drilling, a stress zone may be formed on the inner wall of each first connection via 11 and in a region of about 5 to 20 μm near the first connection via on the upper surface of the first connection via 11, the surface roughness of the glass substrate 10 in this stress zone shows molten-state burrs, a large number of micro-cracks and macro-cracks are present, and residual stress is present. At this time, an HF etching solution with a concentration of 2% to 20% is used to carry out a wet etching for a certain time at a proper temperature, the glass in the stress zone is etched away such that the inside of the first connection via 11 and the region near the first connection via on the upper surface of the first connection via 11 are smooth and flat without micro-cracks and macro-cracks, and the stress zone is completely etched away.

Figure 5:
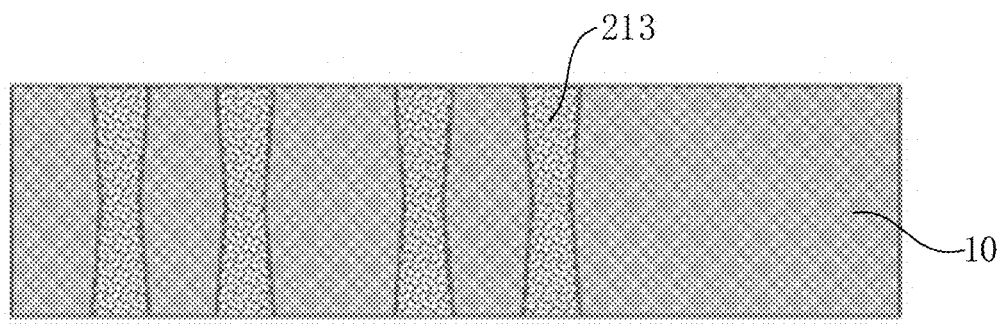
FIG. 5 is a schematic diagram of a substrate formed in step S12 according to an embodiment of the present disclosure.

Step S12, forming the first connection electrodes 213 in the first connection vias 11, respectively, and forming the first conductive film layer 2121 of the second sub-structures 212 of the inductor, as shown in FIG. 5.

In some examples, step S12 may specifically include steps of:

(1) Growing a seed layer: depositing a first metal material on the second surface of the glass substrate 10 by magnetron sputtering, turning over the glass substrate 10, and depositing the first metal material on the first surface by magnetron sputtering, at this time, the first metal material is formed on the sidewall of each first connection via 11, as a seed layer.

In some examples, the first metal material includes, but is not limited to, at least one of copper (Cu), aluminum (Al), molybdenum (Mo), and silver (Ag), and the thickness of the first metal material is about 0.2 μm to 10 μm. In the following description, for example, the material of the first metal film layer is copper.

In some examples, to increase the adhesion (e.g., an adhesive force) of the first metal material to the first surface of the glass substrate 10, an auxiliary metal film layer may be formed on the first surface of the glass substrate 10 by means including, but not limited to, magnetron sputtering, prior to forming the first metal material. The auxiliary metal film layer is made of, but is not limited to, at least one of nickel (Ni), molybdenum (Mo) alloy, and titanium (Ti) alloy, for example, is made of MoNb, and the thickness of the auxiliary metal film layer is about 2 nm to 20 nm.

(2) Electroplating: putting the glass substrate 10 on a carrier of an electroplating machine, pressing on the power-on pad, putting the glass substrate into a via-filling electroplating bath (in which there is a special via-filling electrolyte), applying electric current, keeping the electroplating solution continuously and rapidly flowing on the first surface of the glass substrate 10, such that cations in the electroplating solution obtain electrons on the inner wall of a first connection via 11 and deposit on the inner wall as atoms, wherein the metal copper can be mainly deposited in the first connection via at a high speed (the deposition speed is 0.5 to 3 μm/min), while each of the first surface and the second surface of the glass substrate 10 is a flat area, and the deposition speed of the metal copper on the two surfaces is extremely low (0.005 to 0.05 μm/min), through the special via-filling electrolyte of special proportion. As time increases, the metal copper on the inner wall of the first connection via grows gradually thick, to form a first metal film layer, at this time, the first metal film layer grows by more than 5 μm compared with the first metal material. At this time, the first metal film layer fully fills the first connection via 11.

Figure 6:
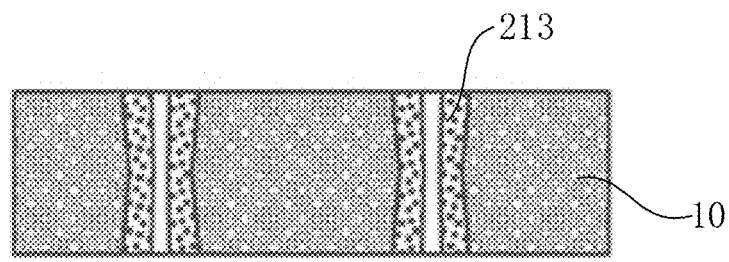
FIG. 6 is a schematic diagram of a substrate formed in step S12 according to an embodiment of the present disclosure.
Figure 7:
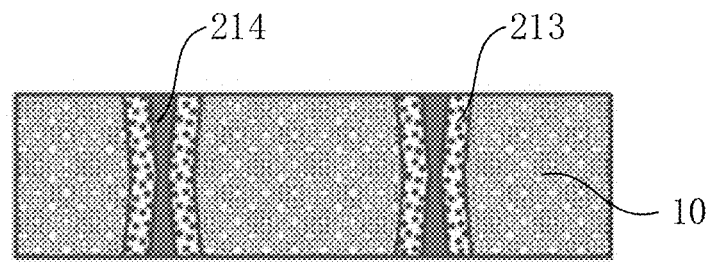
FIG. 7 is a schematic diagram of a substrate formed in step S12 according to an embodiment of the present disclosure.

In some examples, the first metal film layer may not fully fill the first connection via 11, as shown in FIG. 6. In this step, it may be further necessary to form a filling structure 214 in the first connection via 11, as shown in FIG. 7, to planarize the second surface of the glass substrate 10. A material of the filling structure 214 may include an organic insulating material, for example, including a resin material such as polyimide, epoxy resin, acryl, polyester, photoresist, polyacrylate, polyamide, siloxane, or the like. As another example, the organic insulating material includes an elastic material, such as urethane (or ethyl carbamate), thermoplastic polyurethane (TPU), or the like.

It should be noted that, in the embodiment of the present disclosure, the case where the first metal film layer fully fills the first connection via 11 is merely an example for description.

(3) Patterning the metal film layer on the second surface: coating photoresist, on the first metal film layer on the second surface, exposing and developing the photoresist, then carrying out an etching, stripping off the photoresist after the etching, thereby the patterning of first planarization layer 9 and the first metal film layer is finished, and the first conductive film layer 2121 of the second sub-structures 212 of the inductor coil and the first plate 31 of the capacitor, which are positioned on the second surface, are formed at this moment.

In some examples, when forming the first conductive film layer 2121 and the first plate 31 of the capacitor, a step of grinding both of them is also included, so that the first conductive film layer 2121 and the first plate 31 of the capacitor are relative smooth and the thickness thereof meets the requirements on the capacitance.

Figure 8:
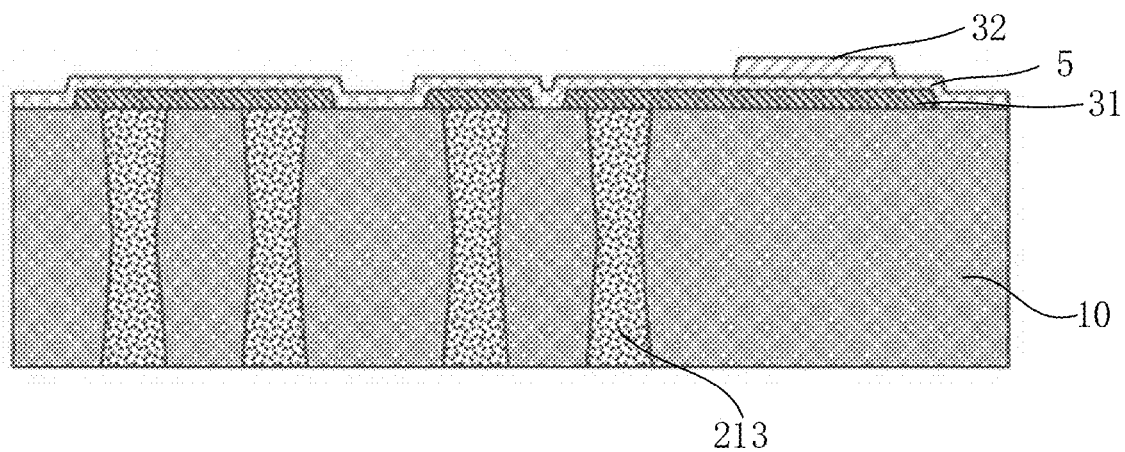
FIG. 8 is a schematic diagram of a substrate formed in step S13 according to an embodiment of the present disclosure.

Step S13, forming a first interlayer dielectric layer 5 on a side of the second sub-structures 212 of the inductor coil away from the glass substrate 10, and forming a pattern including the second plate 32 of the capacitor on a side of the first interlayer dielectric layer 5 away from the glass substrate 10, as shown in FIG. 8.

In some examples, the material of the first interlayer dielectric layer 5 is an inorganic insulating material. For example, the first interlayer dielectric layer 5 is an inorganic insulating layer formed of silicon nitride ($SiN_x$), or an inorganic insulating layer formed of silicon oxide ($SiO_2$), or a plurality of stacked composite film layers of a $SiN_x$ inorganic insulating layer and a $SiO_2$ inorganic insulating layer. Alternatively, the first interlayer dielectric layer 5 further serves as an interlayer dielectric layer of the capacitor.

In some examples, the second plate 32 of the capacitor may be formed by: forming a second metal film layer on a side of the first interlayer dielectric layer 5 away from the glass substrate 10 by magnetron sputtering, then coating photoresist thereon, exposing and developing the photoresist, then carrying out an etching, stripping off the photoresist after the etching, thereby forming the pattern including the second plate 32 of the capacitor.

Figure 9:
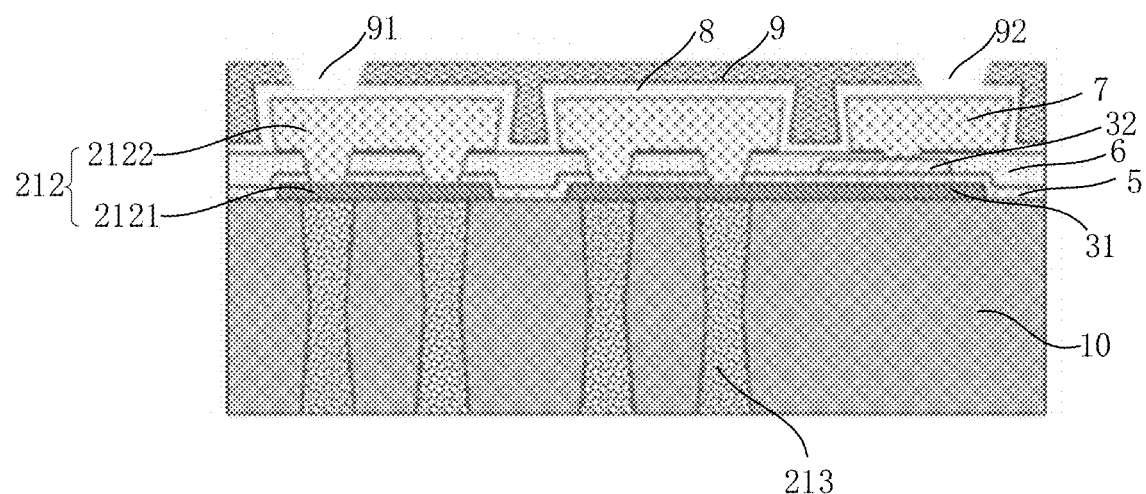
FIG. 9 is a schematic diagram of a substrate formed in steps S14 to S16 according to an embodiment of the present disclosure.

Step S14, forming a second interlayer dielectric layer 6 on a side of the second plate 32 of the capacitor away from the glass substrate 10, and forming a second connection via penetrating through the first interlayer dielectric layer and the second interlayer dielectric layer 6 and a third connection via penetrating through the second interlayer dielectric layer 6, as shown in FIG. 9.

The material of the second interlayer dielectric layer 6 may be the same as that of the first interlayer dielectric layer 5, thus the description thereof is not repeated.

Step S15, forming a pattern including the second conductive film layer 2122 of the second sub-structures 212 and the second connection electrode 7 on a side of the second interlayer dielectric layer 6 away from the glass substrate 10 through a patterning process, wherein the second conductive film layer 2122 is connected to the first conductive film layer 2121 through the second connection via; the second connection electrode 7 is connected to the second plate 32 of the capacitor through the third connection via, as shown in FIG. 9.

In some examples, step S15 may include: forming a third metal film layer by magnetron sputtering, coating photoresist thereon, exposing and developing the photoresist, then carrying out an etching, stripping off the photoresist after the etching, thereby forming the pattern including the second conductive film layer 2122 of the second sub-structures 212 and the second connection electrode 7. The material of the third metal film layer may be the same as that of the first metal film layer, and thus, the description thereof is not repeated herein.

In some examples, the third metal film layer has a thickness of 5 μm or more, and the second conductive film layer 2122 is formed to have a thickness greater than that of the first conductive film layer 2121.

Step S16, sequentially forming a first protective layer 8 and a first planarization layer 9 on a side of the second conductive film layer 2122 and the second connection electrode 7 away from the glass substrate 10; and forming a fourth connection via 91 and a fifth connection via 92 penetrating through the first protective layer 8 and the first planarization layer 9, as shown in FIG. 9.

Wherein the first protective layer 8 is used to prevent water and oxygen from corroding the devices formed on the second surface of the glass substrate 10. A thickness of the first protective layer 8 is 0.1 μm to 2 μm; a material of the first protective layer 8 may be an inorganic insulating material. For example, the first protective layer 8 may be an inorganic insulating layer formed of silicon nitride (SiN$_x$), or an inorganic insulating layer formed of silicon oxide (SiO$_2$), or a plurality of stacked composite film layers of a SiN$_x$ inorganic insulating layer and a SiO$_2$ inorganic insulating layer. A thickness of the first planarization layer 9 is 2 μm or more; a material of the first planarization layer 9 may include an organic insulating material, for example, including a resin material such as polyimide, epoxy resin, acryl, polyester, photoresist, polyacrylate, polyamide, siloxane, or the like. As another example, the organic insulating material includes an elastic material, such as urethane (or ethyl carbamate), Thermoplastic Polyurethane (TPU), or the like.

Figure 10:
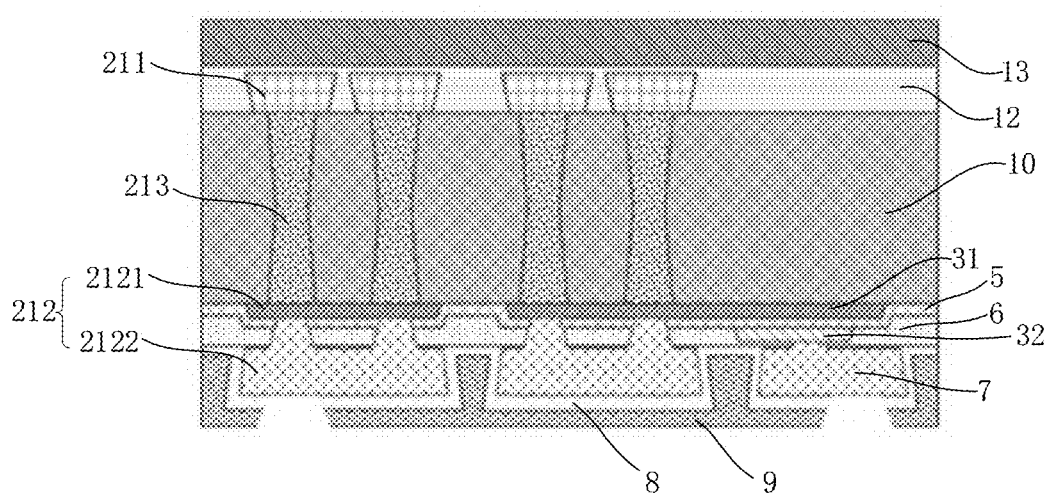
FIG. 10 is a schematic diagram of a substrate formed in steps S17 to S18 according to an embodiment of the present disclosure.

Step S17, turning over the glass substrate 10, and forming a pattern including the first sub-structures 211 of the inductor coil through a patterning process, as shown in FIG. 10.

In some examples, step S17 may include: forming a fourth metal film layer on the first surface of the glass substrate 10 by magnetron sputtering, then coating photoresist thereon, exposing and developing the photoresist, then carrying out a wet etching, stripping off the photoresist after the etching, thereby forming the pattern including the first sub-structures 211 of the inductor coil.

A thickness of the fourth metal film layer is 5 μm or more. A material of the fourth metal film layer may be the same as that of the first metal film layer, and thus, the description thereof is not repeated herein.

Step S18, sequentially forming a second protective layer 12 and a second planarization layer 13 on the side of the first sub-structures 211 away from the glass substrate 10, as shown in FIG. 10.

In some examples, a material of the second protective layer 12 may be the same as the material of the first protective layer 8, and thus, the description thereof is not repeated herein. A material of the second planarization layer 13 may be the same as that of the first planarization layer 9, and thus, the description thereof is not repeated herein. A thickness of second protective layer 12 is substantially the same as that of the first protective layer 8. A thickness of the second planarization layer 13 is substantially the same as that of the first planarization layer 9.

Step S19, turning over the glass substrate 10 again, and forming the first connection pad 14 and the second connection pad 15 in the fourth connection via 91 and the fifth connection via 92, respectively. The first connection pad 14 and the second connection pad 15 each may be a solder, as shown in FIG. 3.

In this way, the manufacturing of the substrate integrated with the passive devices is completed.

A second example is a method for manufacturing a large-sized substrate integrated with passive devices thereon, the large-sized substrate having a size of 370*470 mm$^2$ or more, the method specifically includes the following steps:

Step S21, providing a glass substrate 10, and processing the glass substrate 10 to form first connection vias 11 penetrating through the glass substrate in the thickness direction of the glass substrate.

In some examples, step S21 may be the same as the above step S11, and thus, the detailed description thereof is not repeated herein.

Figure 11:
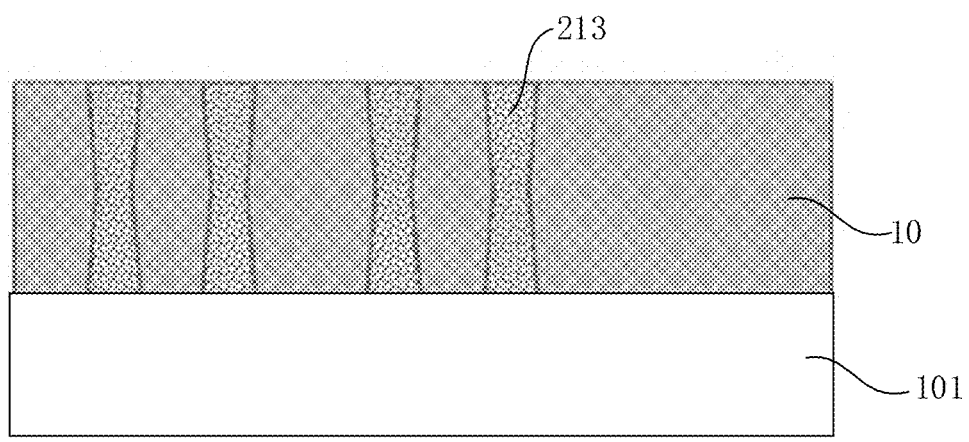
FIG. 11 is a schematic diagram of a substrate formed in step S22 according to an embodiment of the present disclosure.
Figure 12:
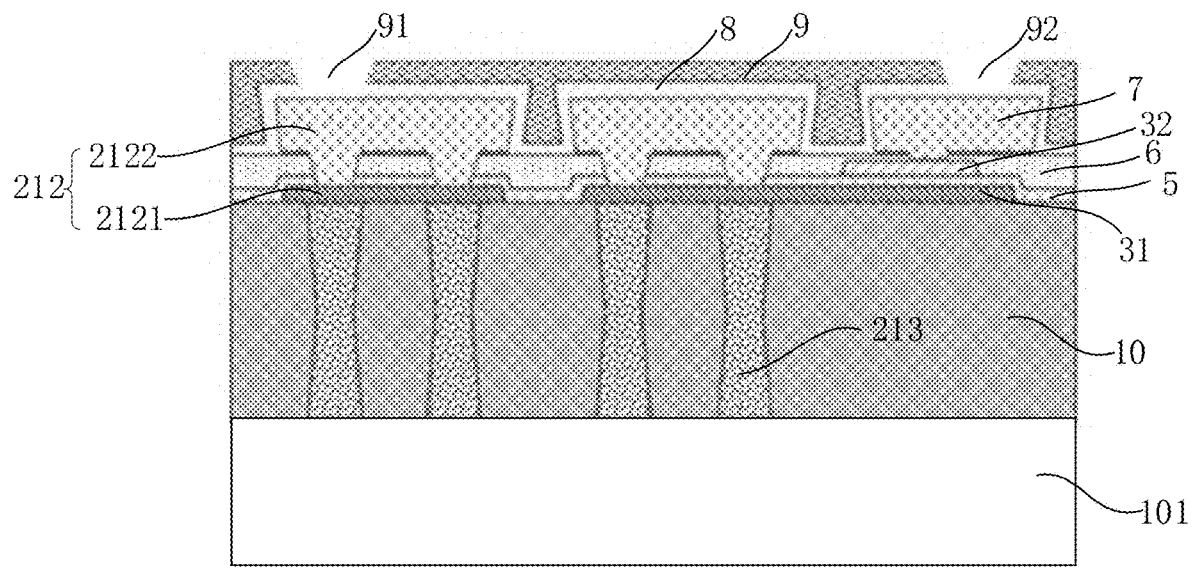
FIG. 12 is a schematic diagram of a substrate formed in step S22 according to an embodiment of the present disclosure.

Step S22, attaching the first surface of the glass substrate 10 to a first substrate 101, as shown in FIG. 11. Forming the first conductive film layer 2121 and the second conductive film layer 2122 of the second sub-structures 212 of the inductor, the first plate 31 and the second plate 32 of the capacitor, the first interlayer dielectric layer 5, the second interlayer dielectric layer 6, the connection pads, the first protective layer 8, and the first planarization layer 9 on the second surface, as shown in FIG. 12.

The steps of forming the first conductive film layer 2121 and the second conductive film layer 2122 of the second sub-structures 212 of the inductor, the first plate 31 and the second plate 32 of the capacitor, the first interlayer dielectric layer 5, the second interlayer dielectric layer 6, the connection pads, the first protective layer 8, and the first planarization layer 9 are the same as the above steps S12 to S16, and thus, the description thereof is not repeated herein.

In some examples, the first substrate 101 may be a glass substrate with a thickness of about 0.4 mm to 0.5 mm; the first substrate 101 and the first surface of the glass substrate 10 may be bonded by an adhesive, and specifically, the adhesive may be a liquid adhesive or a solid adhesive.

Figure 13:
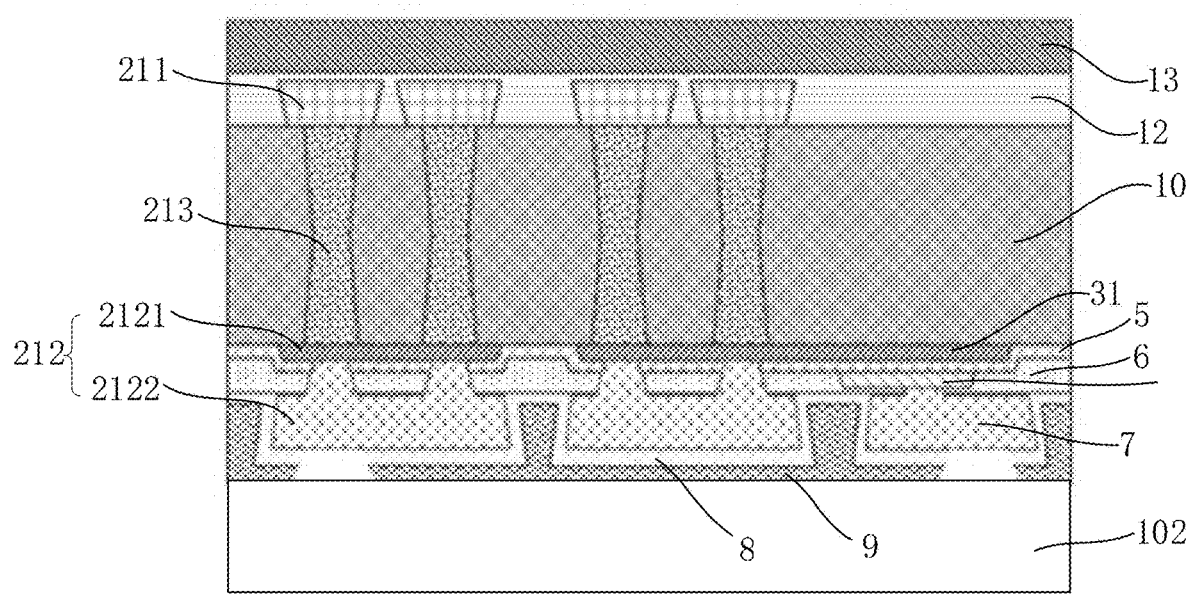
FIG. 13 is a schematic diagram of a substrate formed in steps S23 to S24 according to an embodiment of the present disclosure.

Step S23, after forming the structures of the first conductive film layer 2121 and the second conductive film layer 2122 of the second sub-structures 212 of the inductor, the first plate 31 and the second plate 32 of the capacitor, the first interlayer dielectric layer 5, the second interlayer dielectric layer 6, the connection pads, the first protective layer 8, and the first planarization layer 9 on the second surface, peeling off the first substrate 101, and attaching the first planarization layer 9 to a second substrate 102, as shown in FIG. 13.

In some examples, the second substrate 102 may be a glass substrate with a thickness of about 0.4 mm to 0.5 mm; the second substrate 102 and the first planarization layer 9 may be bonded by an adhesive, and specifically, the adhesive may be a liquid adhesive or a solid adhesive.

Step S24, forming the first sub-structures 211, the second protective layer 12, and the second planarization layer 13 on the first surface of the glass substrate 10, as shown in FIG. 13.

The steps of forming the first sub-structures 211, the second protective layer 12 and the second planarization layer 13 are the same as the steps S17 and S18, and thus, the description thereof is not repeated herein.

Step S25, peeling off the second substrate 102, turning over the glass substrate 10 again, and forming the first connection pad 14 and the second connection pad 15 in the fourth connection via 91 and the fifth connection via 92, respectively. The first connection pad 14 and the second connection pad 15 each may be a solder, as shown in FIG. 3.

In this way, the manufacturing of the substrate integrated with the passive devices is completed.

Figure 14:
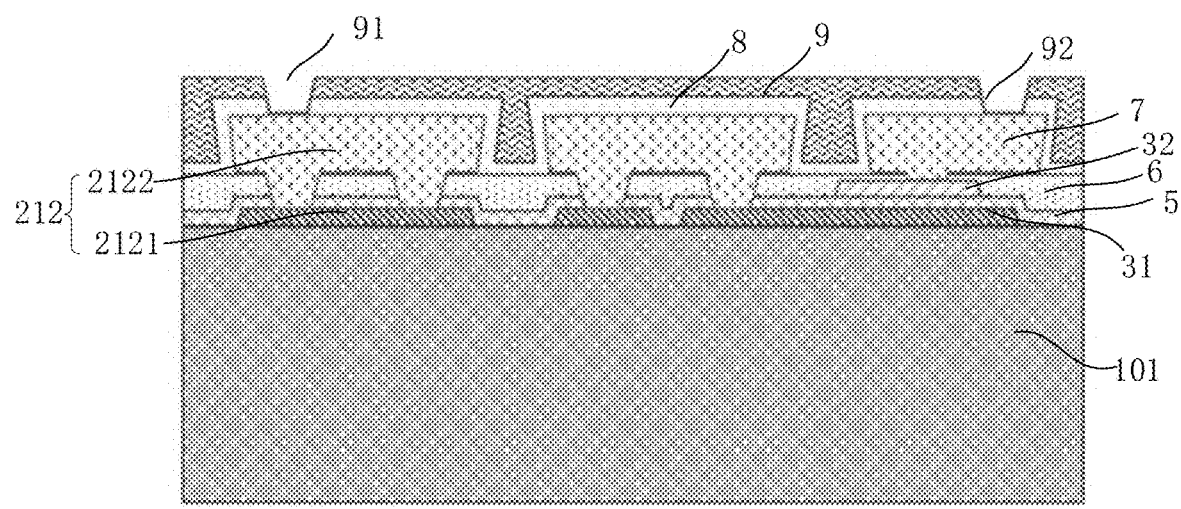
FIG. 14 is a schematic diagram of a substrate formed in step S31 according to an embodiment of the present disclosure.

A third example is a method for manufacturing a large-sized substrate integrated with passive devices thereon, the large-sized substrate having a size of 370*470 mm$^2$ or more, the method specifically includes the following steps:

Step S31, providing a first substrate 101, and forming structures of the first conductive film layer 2121 and the second conductive film layer 2122 of the second sub-structures 212 of the inductor, the first plate 31 and the second plate 32 of the capacitor, the first interlayer dielectric layer 5, the second interlayer dielectric layer 6, the connection pads, the first protective layer 8, and the first planarization layer 9 on a second surface of the first substrate 101, as shown in FIG. 14.

The steps of forming the first conductive film layer 2121 and the second conductive film layer 2122 of the second sub-structures 212 of the inductor, the first plate 31 and the second plate 32 of the capacitor, the first interlayer dielectric layer 5, the second interlayer dielectric layer 6, the connection pads, the first protective layer 8, and the first planarization layer 9 are the same as the above steps S12 to S16, and thus, the description thereof is not repeated herein.

In some examples, the first substrate 101 may be a glass substrate with a thickness of about 0.4 mm to 0.5 mm.

Figure 15:
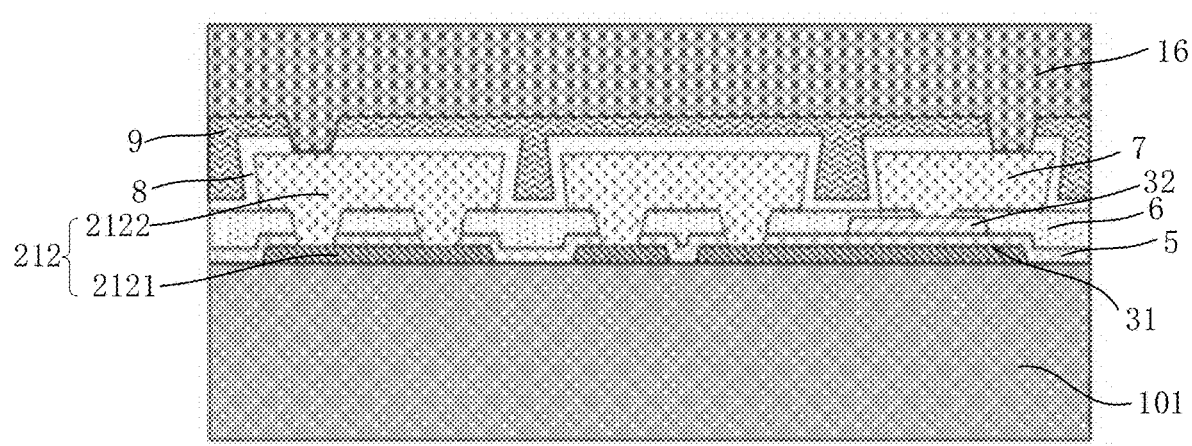
FIG. 15 is a schematic diagram of a substrate formed in step S32 according to an embodiment of the present disclosure.
Figure 16:
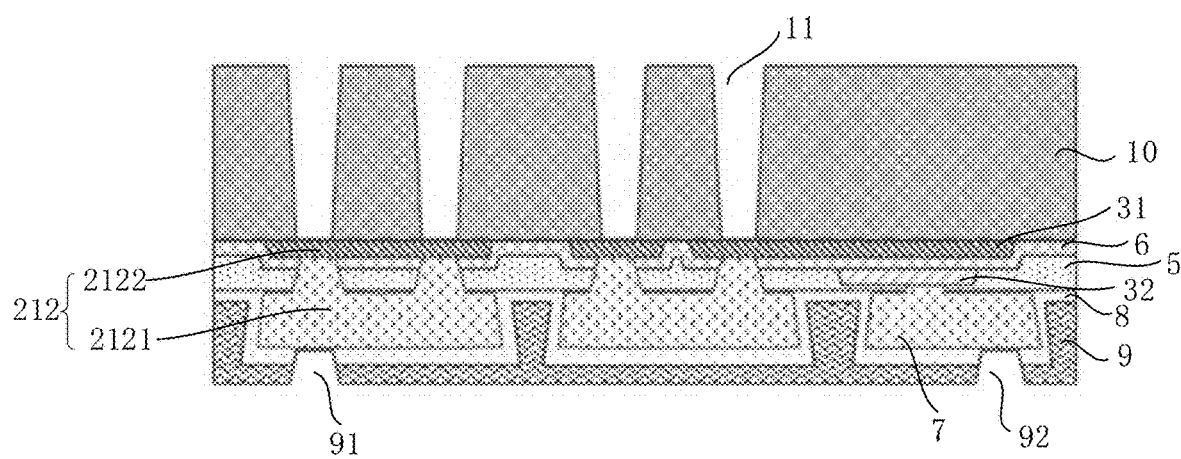
FIG. 16 is a schematic diagram of a substrate formed in step S32 according to an embodiment of the present disclosure.

Step S32, after forming the structures of the first conductive film layer 2121 and the second conductive film layer 2122 of the second sub-structures 212 of the inductor, the first plate 31 and the second plate 32 of the capacitor, the first interlayer dielectric layer 5, the second interlayer dielectric layer 6, the connection pads, the first protective layer 8, and the first planarization layer 9 on the second surface, thinning the first substrate 101, and punching the thinned first substrate 101 to form the first connection vias 11 therein, so as to form the glass substrate 10, as shown in FIGS. 15 and 16.

In some examples, the first connection vias 11 may be formed by employing the above step S11.

It should be noted that, when the first substrate 101 is to be thinned, a filling layer 16 may be formed on a side of the first planarization layer 9 away from the first substrate 101, so that the side of the first planarization layer 9 away from the first substrate 101 is planarized, so as to facilitate the thinning of the first substrate 101. After the thinning is finished, the filling layer 16 is removed. The filling layer 16 may be made of a material such as photoresist or polyimide.

Step S33, forming a fourth metal film layer on the first surface of the glass substrate 10, forming the first connection electrodes 213 in the first connection vias 11, respectively, and forming the first sub-structures 211 of the inductor coil.

In some examples, the first connection electrodes 213 and the first sub-structures 211 of the inductor coil may be formed by the same step as the step S12, and thus, the description thereof is not repeated herein.

Step S34, forming the second protective layer 12 and the second planarization layer 13 on a side of the first sub-structure 211 away from the glass substrate 10.

The step of forming the second protective layer 12 and the second planarization layer 13 is the same as the above step S18, and thus, the description thereof is not repeated herein.

Step S35, peeling off the second substrate 102, turning over the glass substrate 10 again, and forming the first connection pad 14 and the second connection pad 15 in the fourth connection via 91 and the fifth connection via 92, respectively. The first connection pad 14 and the second connection pad 15 each may be a solder, as shown in FIG. 3.

In this way, the manufacturing of the substrate integrated with the passive devices is completed.

It will be understood that the above embodiments are merely exemplary embodiments adopted to illustrate the principles of the present disclosure, and the present disclosure is not limited thereto. It will be apparent to one of ordinary skill in the art that various modifications and improvements can be made without departing from the spirit and scope of the invention, and such modifications and improvements are also considered to be within the scope of the invention.

What is claimed is:

1. A manufacturing method of a substrate integrated with passive devices, comprising:
    providing a transparent dielectric layer with first connection vias therein, wherein the transparent dielectric layer comprises a first surface and a second surface, which are opposite to each other along a thickness direction of the transparent dielectric layer;
    integrating the passive devices onto the transparent dielectric layer, wherein the passive devices comprise at least an inductor,
    wherein the integrating the passive devices onto the transparent dielectric layer comprises:
    forming first sub-structures on the first surface of the transparent dielectric layer, forming second sub-structures on the second surface, and forming first connection electrodes in the first connection vias, respectively;
    wherein the first sub-structures, the first connection electrodes and the second sub-structures are connected together to form a coil structure of the inductor; and
    the manufacturing method further comprises:
    sequentially forming a second protective layer and a second planarization layer on a side of the first sub-structures distal to the transparent dielectric layer.

2. The manufacturing method according to claim 1, wherein
    providing the transparent dielectric layer comprises processing the transparent dielectric layer to form the first connection vias penetrating through the transparent dielectric layer in the thickness direction of the transparent dielectric layer;
    forming the first connection electrodes in the first connection vias comprises making the first connection electrodes at least cover inner walls of the first connection vias;
    forming a pattern comprising the second sub-structures on the second surface through a patterning process; and
    forming a pattern of the first sub-structures on the first surface through a patterning process.

3. The manufacturing method according to claim 2, wherein, prior to the forming the first connection electrodes in the first connection vias, the manufacturing method further comprises:
    attaching the first surface of the transparent dielectric layer to a first substrate;
    the manufacturing method further comprises:
    prior to forming the first sub-structures, peeling off the first substrate from the first surface of the transparent dielectric layer; and attaching a second substrate to a side of the second sub-structures away from the transparent dielectric layer.

4. The manufacturing method according to claim 1, wherein forming the first connection vias is subsequent to the forming the second sub-structures.

5. The manufacturing method according to claim 4, wherein the forming the first connection vias comprises:
thinning the transparent dielectric layer, and processing the transparent dielectric layer to form the first connection vias penetrating through the transparent dielectric layer in the thickness direction of the transparent dielectric layer.

6. The manufacturing method according to claim 1, wherein the passive devices further comprises a capacitor; the manufacturing method further comprises:
forming a pattern comprising a first plate of the capacitor on the second surface through a patterning process;
forming a first interlayer dielectric layer on a side of the first plate of the capacitor distal to the transparent dielectric layer;
forming a pattern comprising a second plate of the capacitor on a side of the first interlayer dielectric layer distal to the transparent dielectric layer, through a patterning process.

7. A manufacturing method of a substrate integrated with passive devices, comprising:
providing a transparent dielectric layer with first connection vias therein, wherein the transparent dielectric layer comprises a first surface and a second surface, which are opposite to each other along a thickness direction of the transparent dielectric layer;
integrating the passive devices onto the transparent dielectric layer, wherein the passive devices comprise at least an inductor,
wherein the integrating the passive devices onto the transparent dielectric layer comprises:
forming first sub-structures on the first surface of the transparent dielectric layer, forming second sub-structures on the second surface, and forming first connection electrodes in the first connection vias, respectively;
wherein the first sub-structures, the first connection electrodes and the second sub-structures are connected together to form a coil structure of the inductor;
wherein the passive devices further comprises a capacitor; the manufacturing method further comprises:
forming a pattern comprising a first plate of the capacitor on the second surface through a patterning process;
forming a first interlayer dielectric layer on a side of the first plate of the capacitor distal to the transparent dielectric layer; and
forming a pattern comprising a second plate of the capacitor on a side of the first interlayer dielectric layer distal to the transparent dielectric layer, through a patterning process;
wherein the second sub-structures comprise a first conductive film layer and a second conductive film layer sequentially arranged along a direction away from the second surface;
the first conductive film layer and the first plate of the capacitor are manufactured through one patterning process;
the manufacturing method further comprises:
forming a second interlayer dielectric layer on a side of the second plate of the capacitor distal to the transparent dielectric layer, and forming a second connection via penetrating through the first interlayer dielectric layer and the second interlayer dielectric layer;
wherein the second conductive film layer is formed on a side of the second interlayer dielectric layer distal to the transparent dielectric layer, and is connected to the first conductive film layer through the second connection via.

8. The manufacturing method according to claim 7, further comprising: grinding the first conductive film layer and the first plate of the capacitor.

9. The manufacturing method according to claim 7, further comprising:
forming a third connection via penetrating through the second interlayer dielectric layer while forming the second connection via; forming a second connection electrode while forming the second conductive film layer, wherein the second connection electrode is connected to the second plate of the capacitor through the third connection via;
sequentially depositing a first protective layer and a first planarization layer on a side of the second conductive film layer and the second connection electrode distal to the second interlayer dielectric layer;
forming a fourth connection via and a fifth connection via penetrating through the first protective layer and the first planarization layer; and
forming a first connection pad and a second connection pad; wherein the first connection pad is connected to a lead terminal of the inductor through the four connection via, and the second connection pad is connected to the second connection electrode through the fifth connection pad.

10. The manufacturing method according to claim 1, wherein in a case where the first connection electrodes do not fully fill the first connection vias, respectively, forming filling structures in the first connection vias, respectively, between the forming the first connection electrodes and the forming the second sub-structures.

11. The manufacturing method according to claim 1, wherein the transparent dielectric layer comprises a glass substrate.

12. A substrate integrated with passive devices, comprising a transparent dielectric layer and the passive devices integrated on the transparent dielectric layer, wherein
the transparent dielectric layer comprises a first surface and a second surface which are opposite to each other along a thickness direction of the transparent dielectric layer; and the transparent dielectric layer has therein first connection vias penetrating through the transparent dielectric layer along the thickness direction of the transparent dielectric layer;
the passive devices comprise at least an inductor; the inductor comprises first sub-structures on the first surface, second sub-structures on the second surface, and first connection electrodes respectively in the first connection vias for sequentially connecting the first sub-structures and the second sub-structures together;
wherein the passive devices further comprise a capacitor, the capacitor comprises a first plate and a second plate sequentially arranged along a direction away from the second surface, and a first interlayer dielectric layer is between layers where the first plate and the second plate are located, respectively;
wherein the second sub-structures comprise a first conductive film layer and a second conductive film layer sequentially arranged along a direction away from the second surface;

the first conductive film layer and the first plate of the capacitor are in a same layer and comprise a same material; and a second interlayer dielectric layer is on a side of the second plate of the capacitor distal to the transparent dielectric layer, the second conductive film layer is on a side of the second interlayer dielectric layer distal to the transparent dielectric layer; the second conductive film layer is connected to the first conductive film layer through a second connection via which penetrates through the first interlayer dielectric layer and the second interlayer dielectric layer.

13. The manufacturing method according to claim 2, wherein the passive devices further comprises a capacitor; the manufacturing method further comprises:

forming a pattern comprising a first plate of the capacitor on the second surface through a patterning process;

forming a first interlayer dielectric layer on a side of the first plate of the capacitor distal to the transparent dielectric layer;

forming a pattern comprising a second plate of the capacitor on a side of the first interlayer dielectric layer distal to the transparent dielectric layer, through a patterning process.

14. The manufacturing method according to claim 3, wherein the passive devices further comprises a capacitor; the manufacturing method further comprises:

forming a pattern comprising a first plate of the capacitor on the second surface through a patterning process;

forming a first interlayer dielectric layer on a side of the first plate of the capacitor distal to the transparent dielectric layer;

forming a pattern comprising a second plate of the capacitor on a side of the first interlayer dielectric layer distal to the transparent dielectric layer, through a patterning process.

15. The manufacturing method according to claim 4, wherein the passive devices further comprises a capacitor; the manufacturing method further comprises:

forming a pattern comprising a first plate of the capacitor on the second surface through a patterning process;

forming a first interlayer dielectric layer on a side of the first plate of the capacitor distal to the transparent dielectric layer;

forming a pattern comprising a second plate of the capacitor on a side of the first interlayer dielectric layer distal to the transparent dielectric layer, through a patterning process.

16. The manufacturing method according to claim 5, wherein the passive devices further comprises a capacitor; the manufacturing method further comprises:

forming a pattern comprising a first plate of the capacitor on the second surface through a patterning process;

forming a first interlayer dielectric layer on a side of the first plate of the capacitor distal to the transparent dielectric layer;

forming a pattern comprising a second plate of the capacitor on a side of the first interlayer dielectric layer distal to the transparent dielectric layer, through a patterning process.

17. The manufacturing method according to claim 2, wherein in a case where the first connection electrodes do not fully fill the first connection vias, respectively, forming filling structures in the first connection vias, respectively, between the forming the first connection electrodes and the forming the second sub-structures.

18. The manufacturing method according to claim 6, wherein the second sub-structures comprise a first conductive film layer and a second conductive film layer sequentially arranged along a direction away from the second surface;

the first conductive film layer and the first plate of the capacitor are manufactured through one patterning process;

the manufacturing method further comprises:

forming a second interlayer dielectric layer on a side of the second plate of the capacitor distal to the transparent dielectric layer, and forming a second connection via penetrating through the first interlayer dielectric layer and the second interlayer dielectric layer;

wherein the second conductive film layer is formed on a side of the second interlayer dielectric layer distal to the transparent dielectric layer, and is connected to the first conductive film layer through the second connection via.

19. The substrate according to claim 12, wherein the passive devices further comprises a capacitor, which comprises: a first plate on the second surface, a first interlayer dielectric layer on a side of the first plate distal to the transparent dielectric layer, and a second plate on a side of the first interlayer dielectric layer distal to the transparent dielectric layer;

the second sub-structures comprise a first conductive film layer and a second conductive film layer sequentially arranged along a direction away from the second surface; and the substrate further comprises a second interlayer dielectric layer on a side of the second plate of the capacitor distal to the transparent dielectric layer, and a second connection via penetrating through the first interlayer dielectric layer and the second interlayer dielectric layer.

20. The substrate according to claim 12, further comprising a second protective layer and a second planarization layer on a side of the first sub-structures distal to the transparent dielectric layer.

* * * * *